(12) United States Patent
Wang et al.

(10) Patent No.: US 7,748,111 B2
(45) Date of Patent: Jul. 6, 2010

(54) MANUFACTURING PROCESS OF A CARRIER

(75) Inventors: Chien-Hao Wang, Hsinchu County (TW); Kuo-Hsiang Lin, Kaohsiung (TW); Yao-Ting Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 92 days.

(21) Appl. No.: 11/874,069

(22) Filed: Oct. 17, 2007

(65) Prior Publication Data

US 2008/0142254 A1    Jun. 19, 2008

(30) Foreign Application Priority Data

Dec. 14, 2006    (TW) .............................. 95146953 A

(51) Int. Cl.
*H05K 3/36* (2006.01)
*H05K 1/02* (2006.01)

(52) U.S. Cl. .............................. 29/830; 29/825; 29/831; 29/832; 29/852; 174/259

(58) Field of Classification Search .................. 29/830, 29/831, 832, 825, 852; 257/683, 684, 685; 438/597, 598; 259/737; 174/259, 261, 268
See application file for complete search history.

(56) References Cited

U.S. PATENT DOCUMENTS

| | | | | |
|---|---|---|---|---|
| 5,756,395 A | * | 5/1998 | Rostoker et al. | ............ 438/622 |
| 6,004,619 A | * | 12/1999 | Dippon et al. | ................ 29/852 |
| 6,026,564 A | * | 2/2000 | Wang et al. | ................... 29/830 |
| 7,095,602 B1 | * | 8/2006 | Kimura | .................... 361/306.3 |

\* cited by examiner

*Primary Examiner*—Derris H Banks
*Assistant Examiner*—Tai Nguyen
(74) *Attorney, Agent, or Firm*—J.C. Patents

(57) ABSTRACT

A manufacturing process of a carrier is disclosed. First, a first substrate is provided. A circuit layer having a number of contacts is formed on a surface of the first substrate. Then, a solder mask is formed on the circuit layer and exposes the contacts. Next, a second substrate having an opening is bonded to the surface of the first substrate to form a carrier, and the opening exposes the solder mask and the contacts of the first substrate. Since the contacts are located within the opening, a circuit layout space can be increased, and a chip disposed in the opening can be electrically connected to the contacts directly, so as to reduce the thickness of a chip package structure. Besides, the carrier is formed by laminating the first and the second substrates. Hence, the manufacturing process of the carrier is simplified and yield of the carrier is promoted.

13 Claims, 9 Drawing Sheets

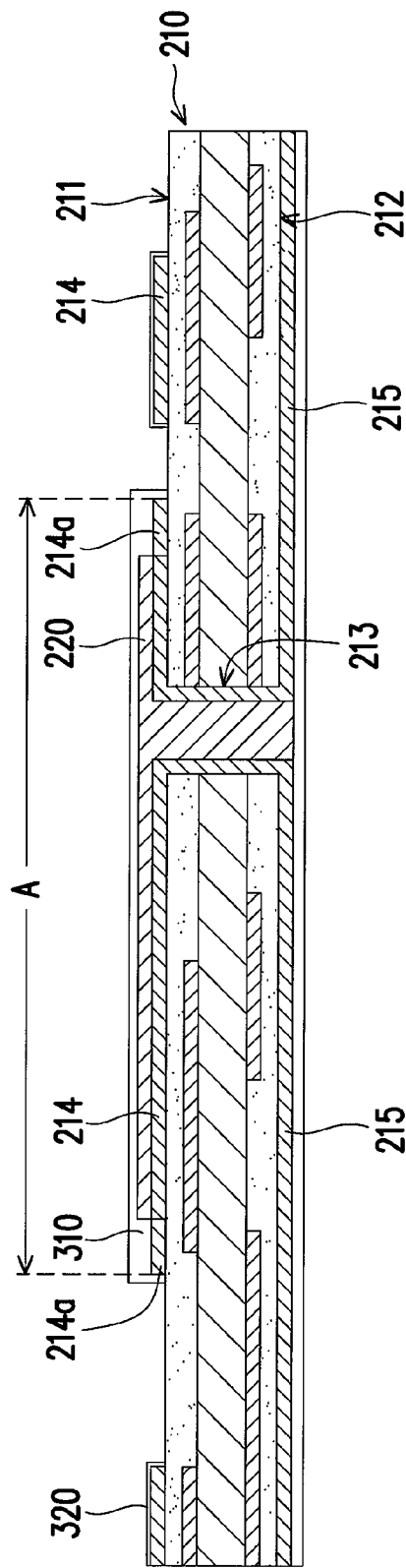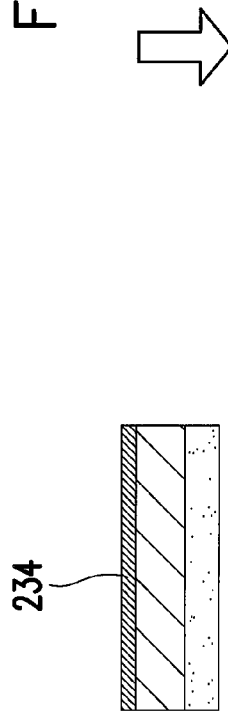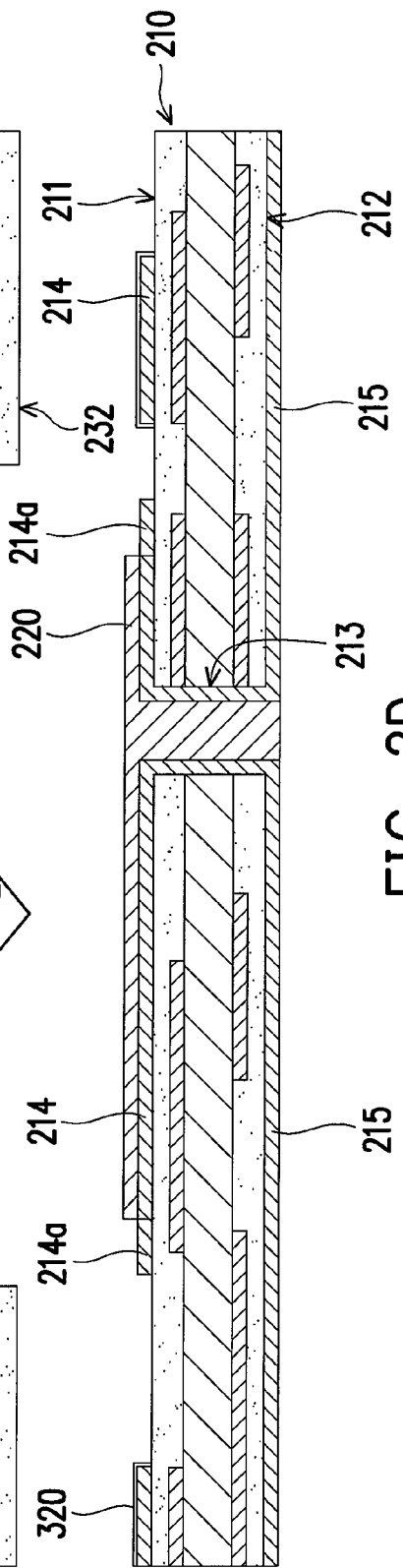

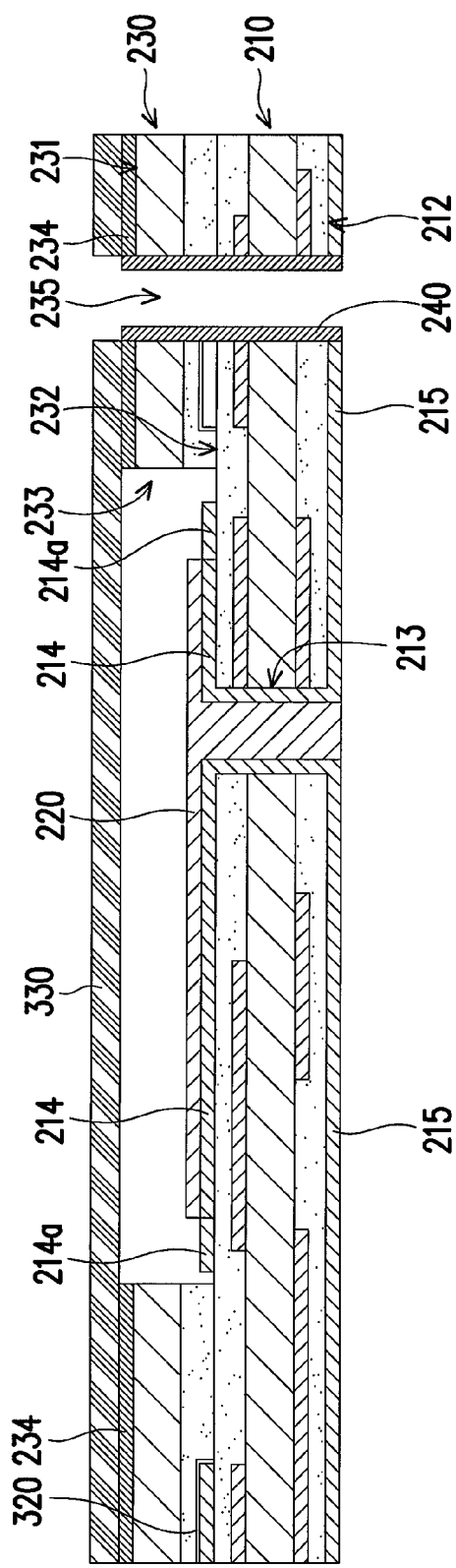
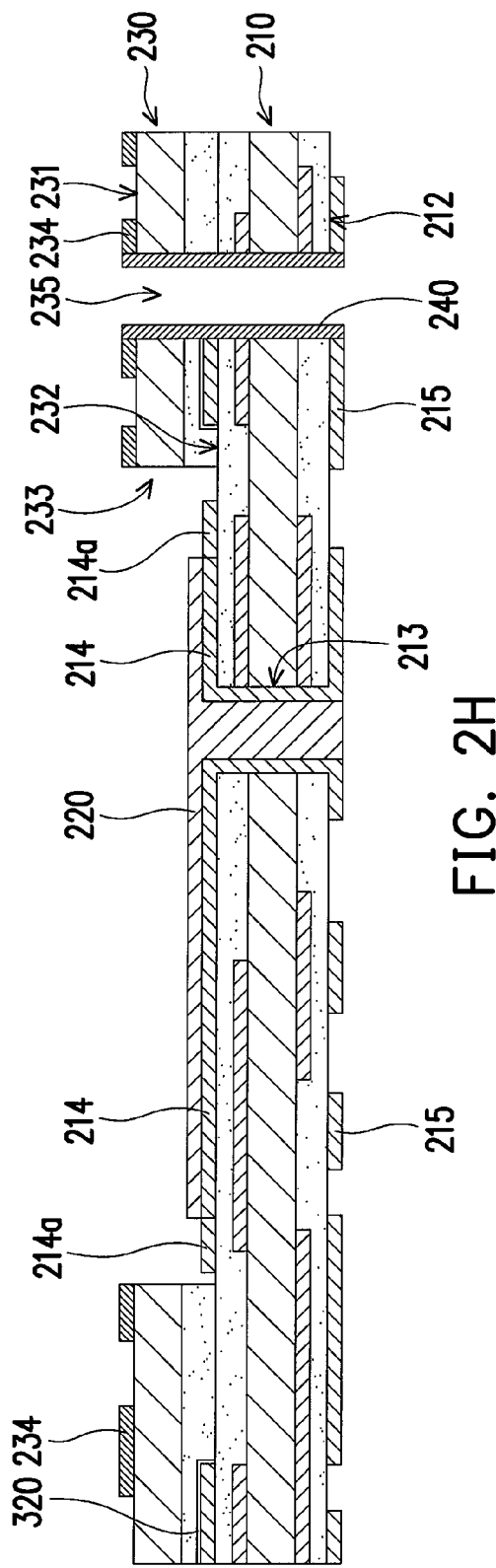
FIG. 2G
FIG. 2H

MANUFACTURING PROCESS OF A CARRIER

CROSS-REFERENCE TO RELATED APPLICATION

This application claims the priority benefit of Taiwan application serial no. 95146953, filed Dec. 14, 2006. All disclosure of the Taiwan application is incorporated herein by reference.

BACKGROUND OF THE INVENTION

1. Field of the Invention

The present invention relates to a carrier, and more particularly to a carrier capable of increasing a circuit layout space.

2. Description of Related Art

As shown in FIG. 1, a conventional chip package structure 100 having a cavity mainly includes a carrier 110, a first chip 120, a second chip 130 and an encapsulant 140. The carrier 110 is usually composed of a substrate 111 and a heat dissipating plate 112. The substrate 111 has an upper surface 113, a lower surface 114 and an opening 115. The heat dissipating plate 112 is adhered to the lower surface 114 of the substrate 111, such that the opening 115 of the substrate 111 may form the cell which is able to accommodate the chips. A plurality of first contacts 116, a plurality of second contacts 117 and a plurality of ball pads 118 are formed on the upper surface 113 of the substrate 111. A back surface 122 of the first chip 120 is adhered to a surface 119 of the heat dissipating plate 112. The second chip 130 is adhered to an active surface 121 of the first chip 120. A plurality of first bonding wires 150 is electrically connected to a plurality of first bonding pads 123 of the first chip 120 and the first contacts 116 of the substrate 111. A plurality of second bonding wires 160 is electrically connected to a plurality of second bonding pads 131 of the second chip 130 and the second contacts 117 of the substrate 111. The encapsulant 140 is formed on the upper surface 113 of the substrate 111, so as to encapsulate the first bonding wires 150 and the second bonding wires 160. A plurality of solder balls 170 is disposed on the ball pads 118, so as to externally connect a circuit board. In addition, the first contacts 116 and the second contacts 117 are formed on the same surface of the substrate 111. Hence, it is required to closely monitor the height of the first bonding wires 150 and that of the second bonding wires 160 for fear that a short circuit may occur due to a contact between the first bonding wires 150 and the second bonding wires 160. Based on the above, the encapsulant 140 may have a greater height, such that the chip package structure 100 has a comparatively significant thickness.

SUMMARY OF THE INVENTION

The present invention is directed to a manufacturing process of a carrier. First, a first substrate is provided. A circuit layer having a plurality of contacts is formed on a surface of the first substrate. Then, a solder mask is formed on the circuit layer and exposes the contacts. Next, a second substrate is bonded to the surface of the first substrate. The second substrate has an opening exposing the solder mask and the contacts of the first substrate. Since the contacts are located in the opening, a circuit layout space can be increased, and a chip disposed in the opening can be electrically connected to the contacts directly, so as to reduce the thickness of a chip package structure.

In a manufacturing process of a carrier of the present invention, a first substrate is provided at first. The first substrate has a first surface, a second surface and a first through hole configured within the first substrate extending from the first surface to the second surface. A first circuit layer having a plurality of contacts is formed on the first surface of the first substrate. A metallic layer is formed on the second surface of the first substrate, and the first circuit layer is electrically connected to the metallic layer. Then, a solder mask is formed on the first circuit layer and exposes the contacts. After that, a second substrate having a third surface, a fourth surface, and an opening configured within the second substrate extending from the third surface to the fourth surface is provided. The fourth surface of the second substrate is bonded to the first surface of the first substrate. The opening exposes the solder mask and the first contacts of the first substrate.

BRIEF DESCRIPTION OF THE DRAWINGS

FIGS. 2A through 2J are schematic cross-sectional views illustrating a manufacturing process of a carrier according to a first embodiment of the present invention.

DESCRIPTION OF EMBODIMENTS

Figure 1:
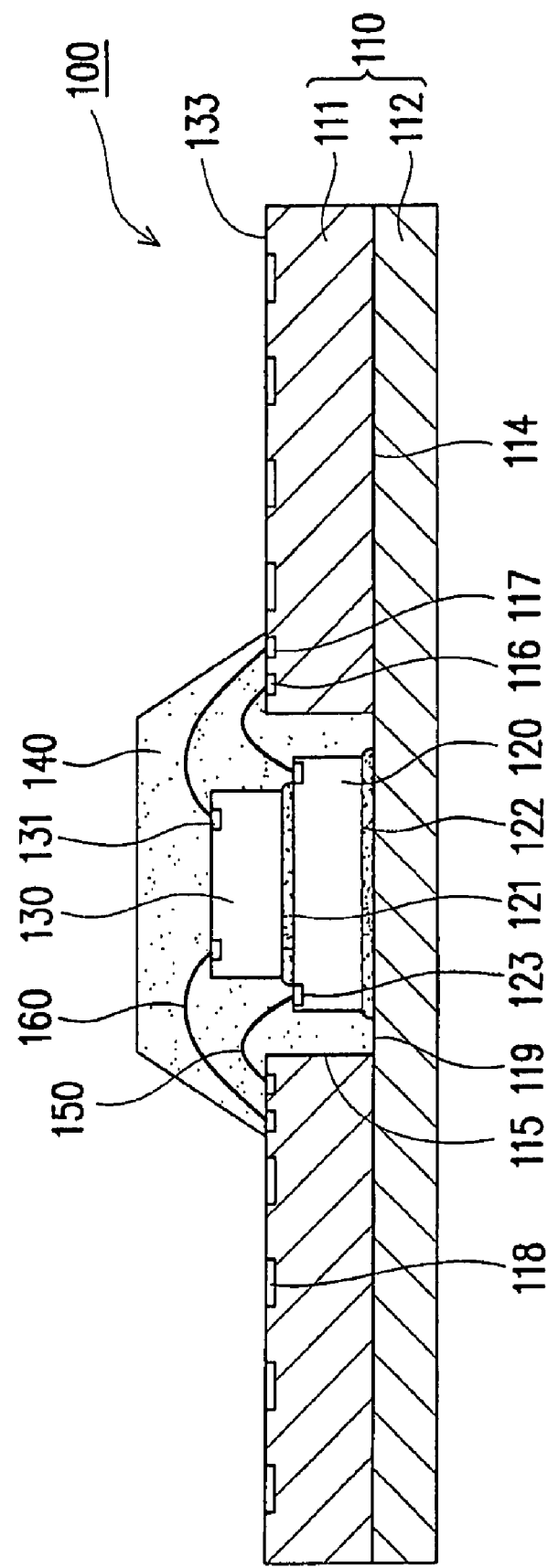
FIG. 1 is a schematic cross-sectional view of a conventional chip package structure.
Figure 2A:
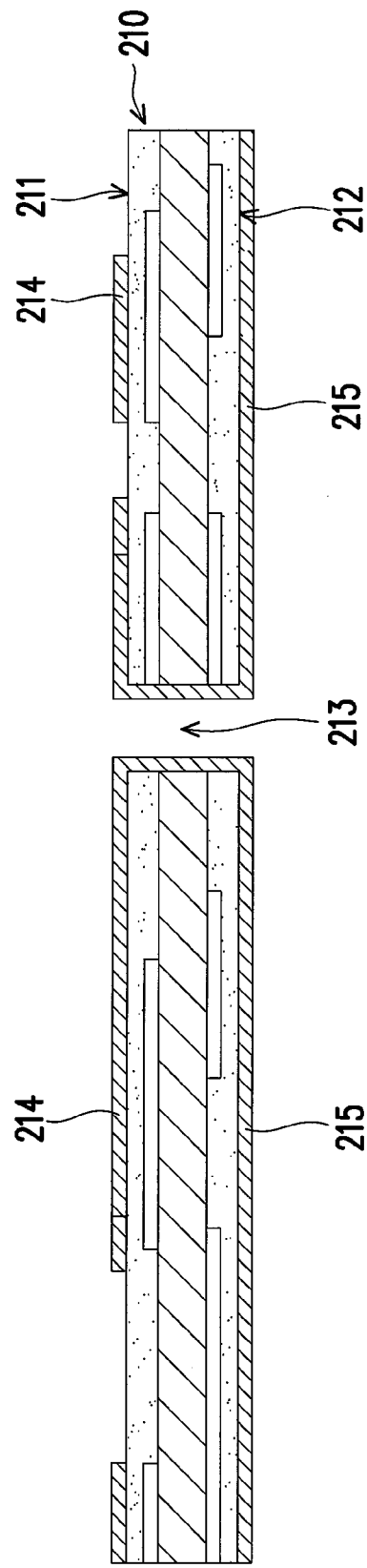
Figure 2B:
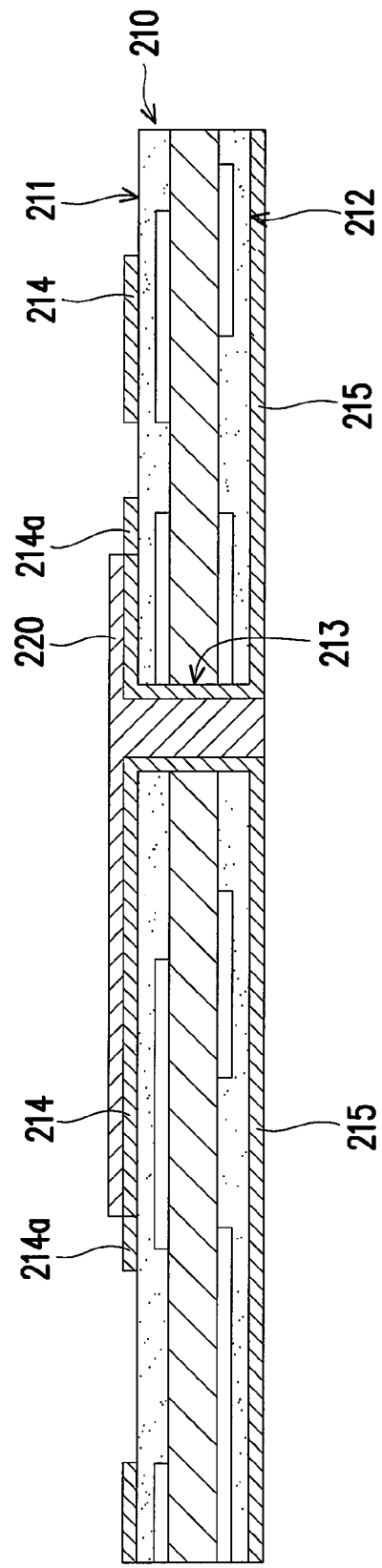
Figure 2E:
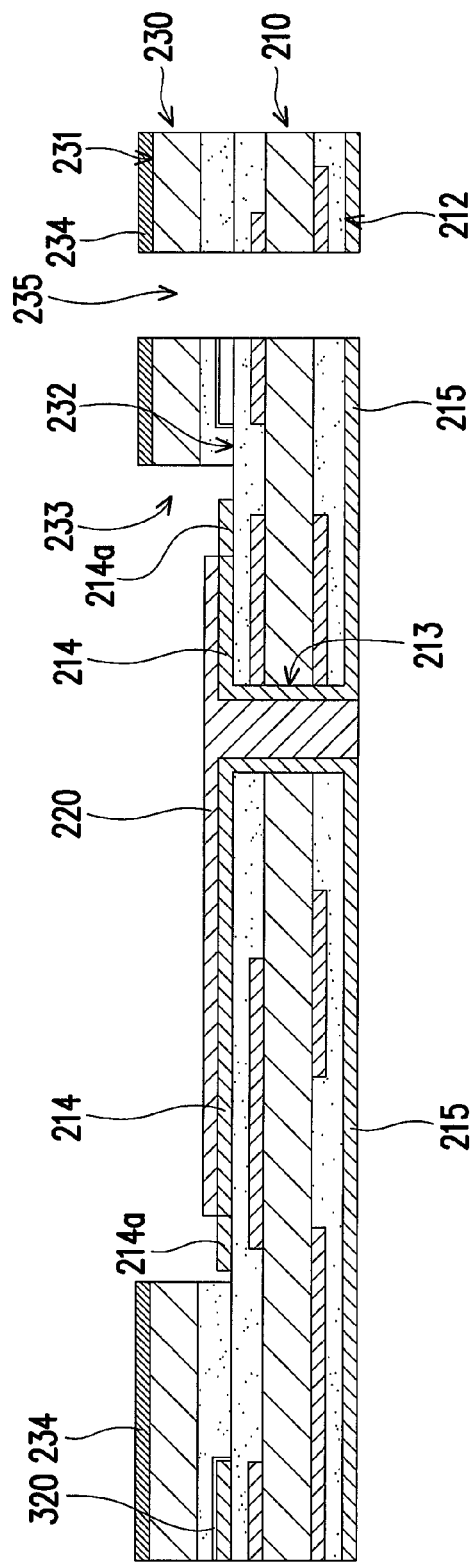
Figure 2F:
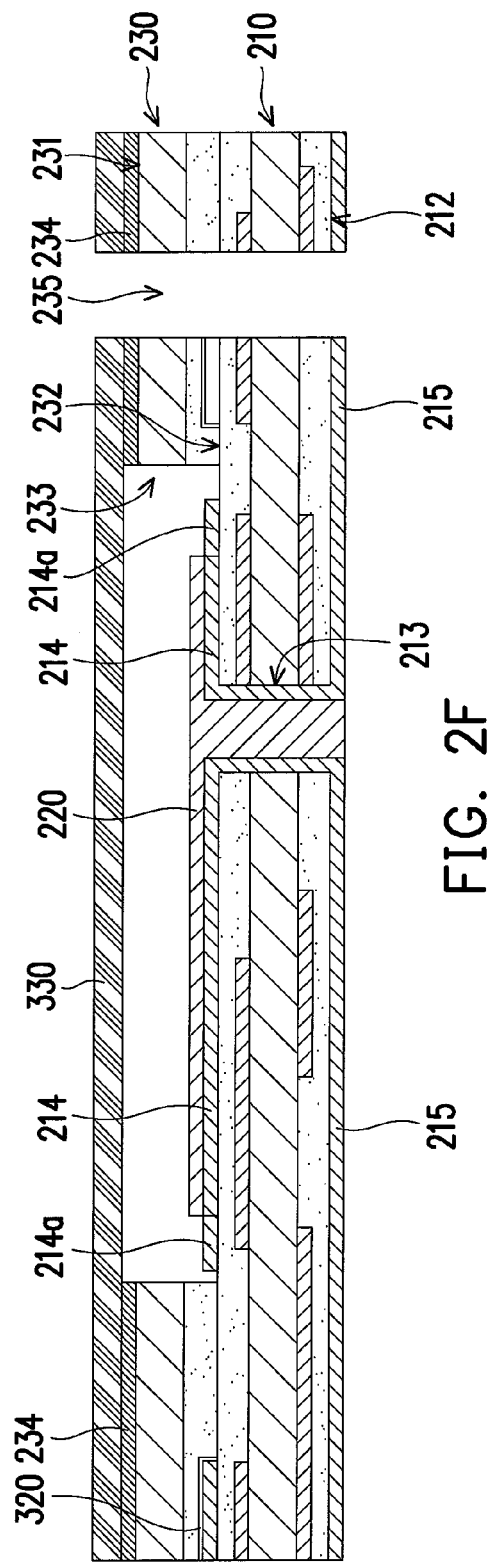
Figure 2I:
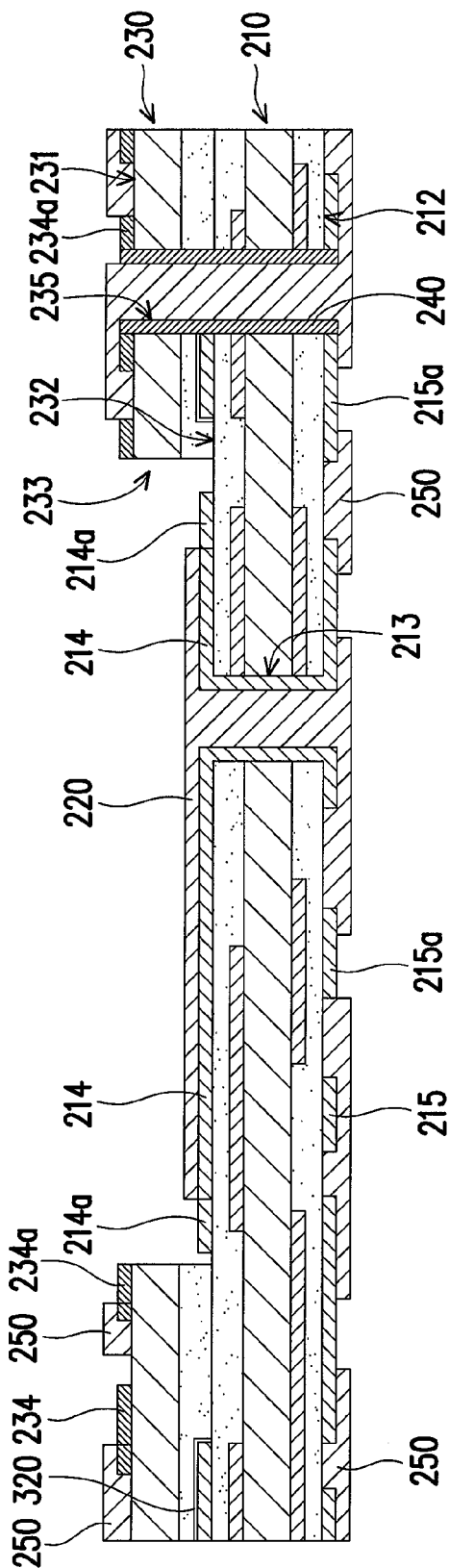
Figure 2J:
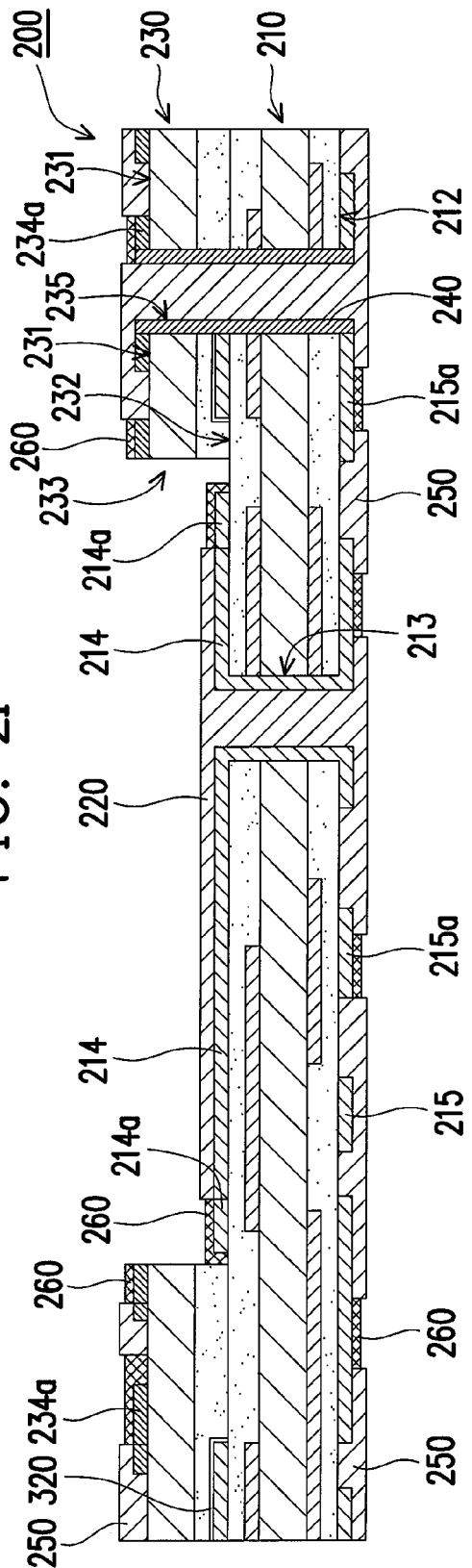

Referring to FIGS. 2A through 2J, a manufacturing process of a carrier 200 is disclosed according to a first embodiment of the present invention. First, referring to FIG. 2A, a first substrate 210 is provided. The first substrate 210 may be a single-layer substrate or a multi-layer circuit substrate. The first substrate 210 has a first surface 211 and a second surface 212. In the present embodiment, the first substrate 210 further has a first through hole 213 configured within the first substrate extending from the first surface 211 to the second surface 212. A patterned first circuit layer 214 is formed on the first surface 211, and the first circuit layer 214 has a plurality of first contacts 214a. An unpatterned first metallic layer 215 is formed on the second surface 212. In an alternative, the first metallic layer 215 may be a patterned circuit layer. However, in the present embodiment, the first metallic layer 215 is not patterned. The first circuit layer 214 is electrically connected to the first metallic layer 215 via the first metallic layer 215 on the inner wall of the first through hole 213. Thereafter, referring to FIG. 2B, a first solder mask 220 is formed on the first circuit layer 214 and in the first through hole 213, and the first solder mask 220 exposes the first contacts 214a. The first solder mask 220 may be formed by a screen printing method or a spin coating method. Next, referring to FIG. 2C, a protection layer 310 may be formed on the first circuit layer 214 and the first contacts 214a. The protection layer 310 covers the first contacts 214a, so as to avoid the first contacts 214a from being oxidized. The protection layer 310 may be made of the solder mask, a photoresist or a tape. In addition, a black oxide layer 320 is further formed on the first circuit layer 214. Here, a device disposing area A is defined on the first surface 211 of the first substrate 210, and the black oxide layer 320 is formed on the first circuit layer 214 outside of the device disposing area A. After that, referring to FIG. 2D, a second substrate 230 is provided and is bonded to the first substrate 210 through a laminating process or the like. The black oxide layer 320 is able to increase a bonding strength between the second substrate 230 and the first substrate 210. The second substrate 230 has a third surface 231, a fourth surface 232 and at least an opening 233 configured within the second substrate extending from the third surface 231 to the fourth surface 232. In the present embodiment, a second circuit layer 234 is formed on the third surface 231, and the second circuit layer 234 is not patterned. The second substrate 230 may be selected from a single-layer or a double-layer copper foil substrate. Then, the fourth surface 232 of the second substrate 230 faces the first surface 211 of the first substrate 210 and is bonded to the first surface 211 of the first substrate 210. The opening 233 of the second substrate 230 exposes the first solder mask 220 and the first contacts 214a of the first substrate 210. Besides, before laminating the first substrate 210 and the second substrate 230, the protection layer 310 covering the first contacts 214a may be removed first. Afterwards, referring to FIG. 2E, a second through hole 235 extending from the third surface 231 of the second substrate 230 to the second surface 212 of the first substrate 210 may be formed by a mechanical drilling method or a laser drilling method. Next, referring to FIG. 2F, a covering layer 330 is formed on the third surface 231 of the second substrate 230 to cover the opening 233 and the second circuit layer 234. Referring to FIG. 2G, a second metallic layer 240 is then formed on an inner wall of the second through hole 235, so as to electrically connect the second circuit layer 234 and the first metallic layer 215. In the present embodiment, the second metallic layer 240 is formed by performing an electroplating process and is made of copper. Before the second metallic layer 240 is electroplated onto the inner wall of the second through hole 235, it is preferable to form an electroplating seed layer on the inner wall of the second through hole 235 by performing a sputtering process, a chemical vapor deposition (CVD) process or an electroless planting process, such that the second metallic layer 240 can be attached to the inner wall of the second through hole 235. Then, referring to FIG. 2H, the covering layer 330 is removed for exposing the first contacts 214a in the opening 233, and the second circuit layer 234 is then patterned. In said patterning process, the first metallic layer 215 may also be patterned simultaneously. Later referring to FIG. 2I, a second solder mask 250 is formed on the second circuit layer 234 and the first metallic layer 215. The second solder mask 250 exposes a plurality of second contacts 234a of the second circuit layer 234 and a plurality of third contacts 215a of the first metallic layer 215. Besides, the second solder mask 250 and the first solder mask 220 may be made of the same material. With reference to FIG. 2J, it is preferable to form an electroplating layer 260 (e.g. nickel-gold layer) on the first contacts 214a, the second contacts 234a and the third contacts 215a. Thereby, the first contacts 214a, the second contacts 234a and the third contacts 215a can be prevented from being oxidized, and a bonding strength between the first contacts 214a, the second contacts 234a and the third contacts 215a and bumps or bonding wires can also be increased. In the present embodiment, the carrier 200 is formed by laminating the first substrate 210 and the second substrate 220 having the opening 233. Hence, the process of manufacturing the carrier 200 is simplified. Further, before the laminating process or the like is performed, the first substrate 210 and the second substrate 220 may be fabricated and inspected first. Accordingly, yield of the carrier 200 is promoted after the implementation of the laminating process. Moreover, since the first contacts 214a are positioned in the opening 233, a circuit layout of the carrier 200 is increased.

Figure 3:
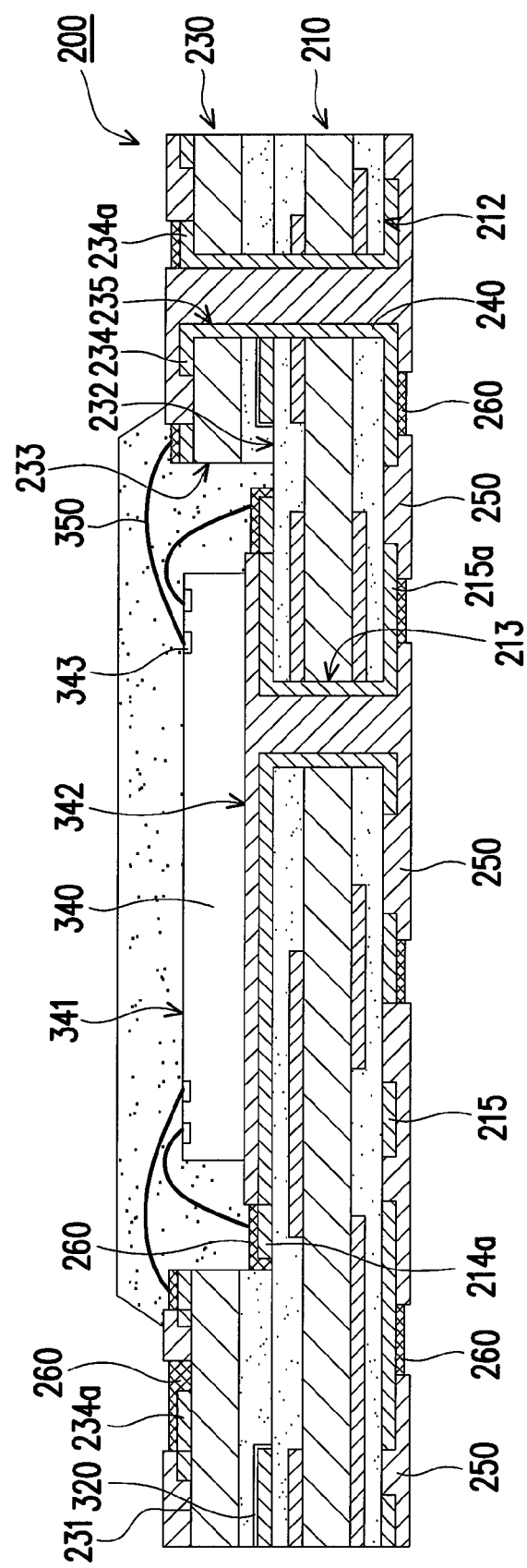
FIG. 3 is a schematic cross-sectional view illustrating a chip package structure in which a chip is disposed in the carrier according to the first embodiment of the present invention.

Please refer to FIG. 3 which illustrates a chip package structure in which a chip 340 is disposed in the opening 233 of the carrier 200. The chip 340 includes an active surface 341, a back surface 342 and a plurality of bonding pads 343. The bonding pads 343 are disposed on the active surface 341 of the chip 340, and the back surface 342 of the chip 340 is disposed in the opening 233. A plurality of bonding wires 350 is electrically connected the bonding pads 343 and the first contacts 214a exposed by the opening 233. Thus, the height of the bonding wires 350 may be reduced, and thereby the total thickness of the chip package structure is decreased.

Figure 4:
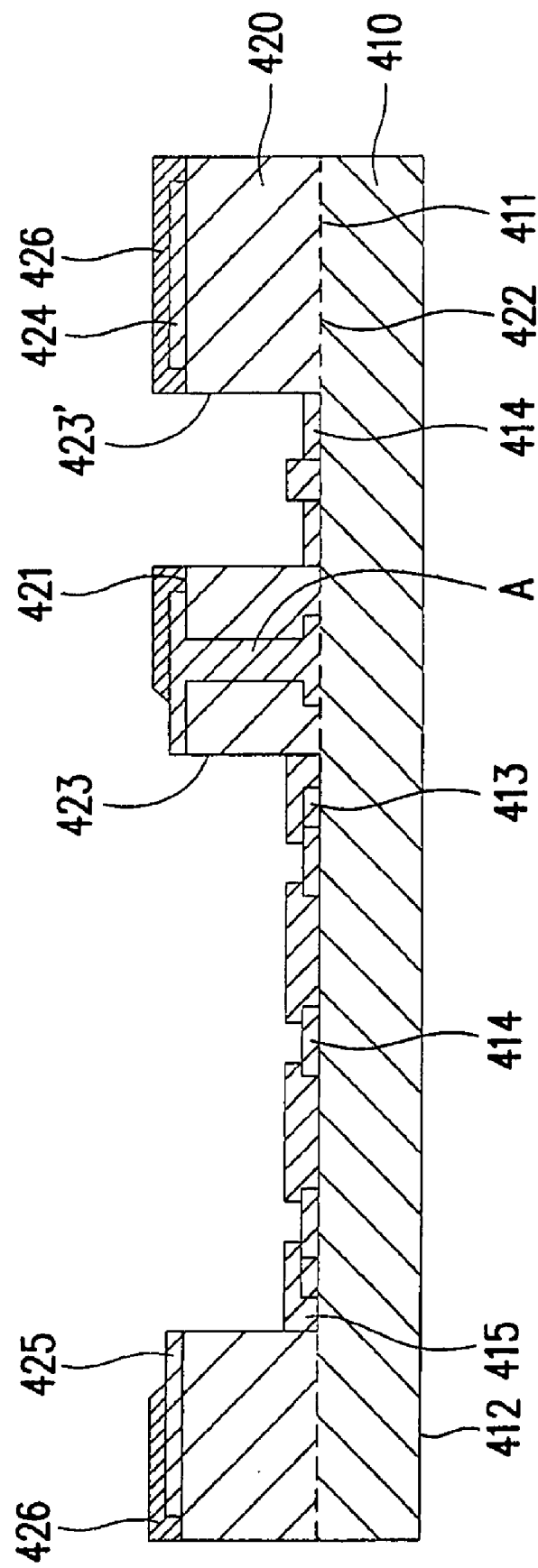
FIG. 4 is a schematic cross-sectional view illustrating another carrier according to a second embodiment of the present invention.
Figure 5:
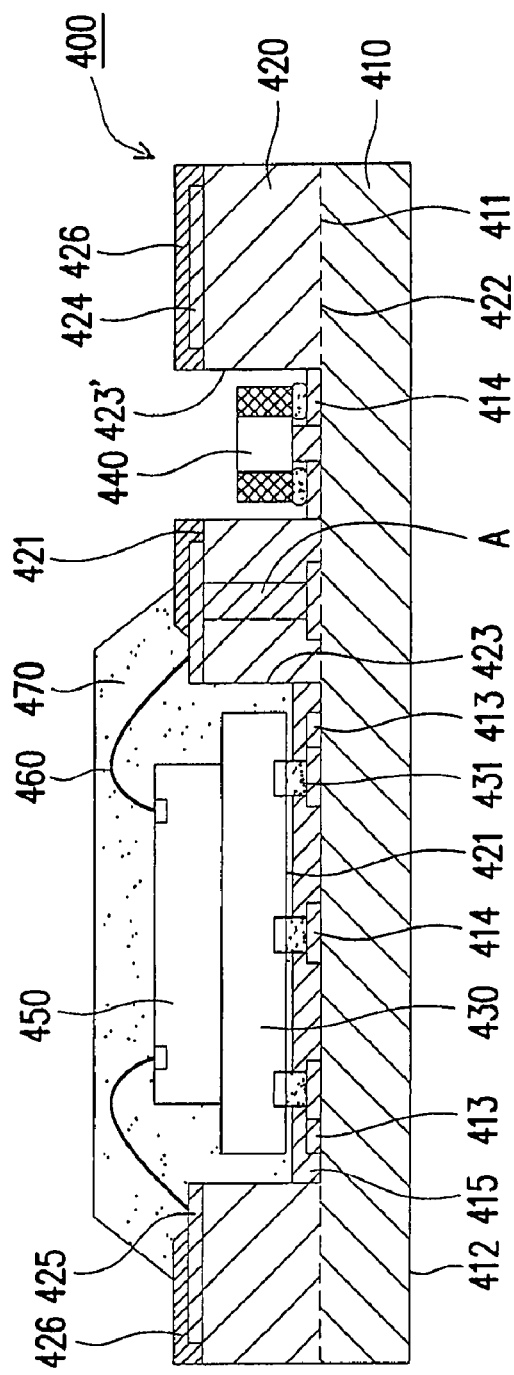
FIG. 5 is a schematic cross-sectional view illustrating a chip and a passive device both disposed in the carrier having an opening according to the second embodiment of the present invention.

On the other hand, please refer to FIG. 4 which depicts a second embodiment of the present invention. A carrier 400 including a first substrate 410 and a second substrate 420 is provided. The first substrate 410 has a first surface 411 and a second surface 412. A patterned first circuit layer 413 is formed on the first surface 411, and the first circuit layer 413 has a plurality of first contacts 414. A first solder mask 415 is formed on the first circuit layer 413 and exposes the first contacts 414. The second substrate 420 has a third surface 421, a fourth surface 422 and a plurality of first openings 423 and 423' extending from the third surface 421 to the fourth surface 422. A patterned second circuit layer 424 is formed on the third surface 421, and the second circuit layer 424 has a plurality of second contacts 425. A second solder mask 426 covering the second circuit layer 424 and exposing the second contacts 425 is formed. The second substrate 420 is bonded to the first substrate 410 through performing the laminating process or the like, and the first openings 423 and 423' expose the first solder mask 415 and the first contacts 414 of the first substrate 410. The second circuit layer 424 may be electrically connected to the first circuit layer 413 via a through hole A. Referring to FIG. 5, a first chip 430 is disposed in the first opening 423, while a passive device 440 is disposed in the first opening 423'. The first chip 430 has a plurality of bumps 431 electrically connected to the first contacts 414 in the first opening 423. The passive device 440 is electrically connected to the first contacts 414 in the first opening 423'. Additionally, a second chip 450 may be stacked on a back of the first chip 430 and electrically connected to the second substrate 420 through a plurality of bonding wires 460. An encapsulant 470 is filled into the first opening 423 to encapsulate the first chip 430, the second chip 450 and the bonding wires 460. In the present embodiment, the carrier 400 having the first openings 423 and 423' are formed by laminating the first substrate 410 and the second substrate 420 having the first openings 423 and 423'. Accordingly, the manufacturing process of the carrier 400 is simplified. Further, before the laminating process is performed, the first substrate 410 and the second substrate 420 may be fabricated and inspected first. Therefore, yield of the carrier 400 is promoted after the implementation of the laminating process. Moreover, a circuit layout space of the carrier 400 is increased, and the thickness of a semiconductor package structure is reduced because the openings 423 and 423' may accommodate different electronic devices.

Figure 6:
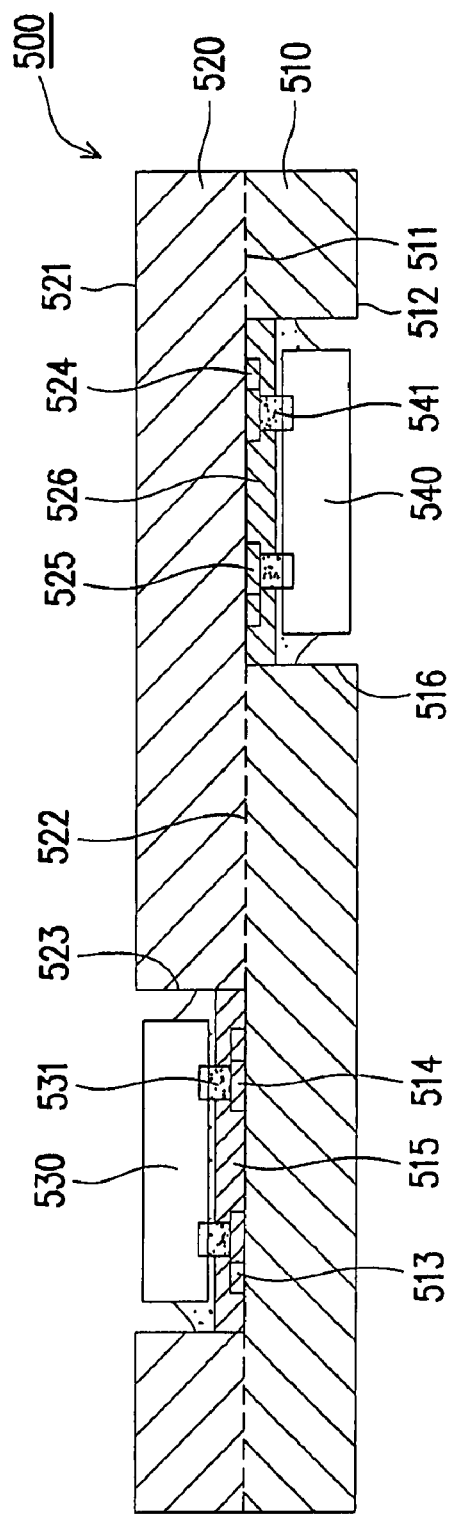
FIG. 6 is a schematic cross-sectional view illustrating a chip disposed in still another carrier having an opening according to a third embodiment of the present invention.

Please refer to FIG. 6 which depicts a third embodiment of the present invention. A carrier 500 including a first substrate 510 and a second substrate 520 is provided. The first substrate 510 has a first surface 511 and a second surface 512. A patterned first circuit layer 513 is formed on the first surface 511, and the first circuit layer 513 has a plurality of first contacts 514. A first solder mask 515 is formed on the first circuit layer 513 and exposes the first contacts 514. The second substrate 520 has a third surface 521 and a fourth surface 522. A patterned second circuit layer 524 is formed on the fourth surface 522, and the second circuit layer 524 has a plurality of second contacts 525. A second solder mask 526 covering the second circuit layer 524 and exposing the second contacts 525 is formed. The second substrate 520 is bonded to the first substrate 510 by performing the laminating process, and the first circuit layer 513 is electrically connected to the second circuit layer 524. In the present embodiment, the second substrate 520 has a first opening 523 extending from the third surface 521 to the fourth surface 522, and the first opening 523 exposes the first contacts 514 of the first substrate 510. The first substrate 510 has a second opening 516 extending from the first surface 511 to the second surface 512, and the second opening 516 exposes the second contacts 525 of the second substrate 520. A first chip 530 is disposed in the first opening 523, while a second chip 540 is disposed in the second opening 516. The first chip 530 has a plurality of first bumps 531 electrically connected to the first contacts 514 in the first opening 523. The second chip 540 has a plurality of second bumps 541 electrically connected to the second contacts 525 in the second opening 516.

It will be apparent to those skilled in the art that various modifications and variations can be made to the present invention without departing from the scope or spirit of the invention. In view of the foregoing, it is intended that the present invention cover modifications and variations of this invention provided they fall within the scope of the following claims and their equivalents.

What is claimed is:

1. A manufacturing process of a carrier, the manufacturing process comprising:
   providing a first substrate having a first surface, a second surface opposite to the first surface, a first through hole within the first substrate extending from the first surface to the second surface, a first circuit layer having a plurality of first contacts being formed on the first surface, and a first metallic layer being formed on the second surface and on an inner wall of the first through hole, wherein the first circuit layer is electrically connected to the first metallic layer;
   forming a first solder mask on the first circuit layer and in the first through hole, wherein the first solder mask exposes the first contacts; and
   providing a second substrate having a third surface, a fourth surface opposite to the third surface, and an opening extending from the third surface to the fourth surface, the fourth surface of the second substrate being bonded to the first surface of the first substrate, wherein the opening exposes the first solder mask and the first contacts of the first substrate.

2. The manufacturing process of the carrier according to claim 1, wherein a black oxide layer is formed on a portion of the first circuit layer that is not covered by the first solder mask.

3. The manufacturing process of the carrier according to claim 2, wherein a device disposing area is defined on the first surface of the first substrate, and the black oxide layer is formed on the first circuit layer outside of the device disposing area.

4. The manufacturing process of the carrier according to claim 1, wherein a second circuit layer is formed on the third surface.

5. The manufacturing process of the carrier according to claim 4, further comprising: forming a second through hole which extends from the third surface of the second substrate to the second surface of the first substrate and forming a second metallic layer on an inner wall of the second through hole to electrically connect the first metallic layer and the second circuit layer.

6. The manufacturing process of the carrier according to claim 4, further comprising: patterning the second circuit layer and forming a plurality of second contacts.

7. The manufacturing process of the carrier according to claim 6, further comprising: forming a second solder mask on the patterned second circuit layer and exposing the second contacts.

8. The manufacturing process of the carrier according to claim 6, further comprising: forming an electroplating layer on the second contacts.

9. The manufacturing process of the carrier according to claim 1, further comprising: forming a covering layer on the third surface of the second substrate to cover the opening.

10. The manufacturing process of the carrier according to claim 9, further comprising: removing the covering layer to expose the first contacts in the opening.

11. The manufacturing process of the carrier according to claim 1, further comprising: forming an electroplating layer on the first contacts.

12. The manufacturing process of the carrier according to claim 1, wherein the first metallic layer comprises a plurality of third contacts.

13. The manufacturing process of the carrier according to claim 12, further comprising: forming an electroplating layer on the third contacts.

* * * * *